United States Patent
Wei (10) Patent No.: US 12,489,099 B2
(45) Date of Patent: Dec. 2, 2025

(54) LIGHT-EMITTING SUBSTRATE, MANUFACTURING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Peihai Wei, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 678 days.

(21) Appl. No.: 17/793,722

(22) PCT Filed: Jul. 12, 2022

(86) PCT No.: PCT/CN2022/105166
§ 371 (c)(1),
(2) Date: Jul. 19, 2022

(87) PCT Pub. No.: WO2024/000647
PCT Pub. Date: Jan. 4, 2024

(65) Prior Publication Data
US 2023/0420431 A1 Dec. 28, 2023

(30) Foreign Application Priority Data
Jun. 28, 2022 (CN) .......................... 202210751104.0

(51) Int. Cl.
*H01L 25/16* (2023.01)
*H01L 23/00* (2006.01)
*H10H 20/857* (2025.01)

(52) U.S. Cl.
CPC ............ *H01L 25/167* (2013.01); *H01L 24/05* (2013.01); *H01L 24/13* (2013.01); *H01L 24/16* (2013.01);
(Continued)

(58) Field of Classification Search
CPC ... H01L 25/167; H01L 25/0753; H01L 25/50; H01L 24/05; H01L 24/13; H01L 24/16;
(Continued)

(56) References Cited

U.S. PATENT DOCUMENTS

2014/0319494 A1 10/2014 Miyashita et al.
2014/0319496 A1 10/2014 Kim et al.
(Continued)

FOREIGN PATENT DOCUMENTS

CN 107564928 A 1/2018
CN 109904080 A 6/2019
(Continued)

OTHER PUBLICATIONS

Chinese Office Action issued in corresponding Chinese Patent Application No. 202210751104.0 dated Jul. 29, 2024, pp. 1-10, 22pp.
(Continued)

*Primary Examiner* — Marlon T Fletcher
*Assistant Examiner* — Christina A Sylvia
(74) *Attorney, Agent, or Firm* — The Roy Gross Law Firm, LLC; Roy D. Gross (57) ABSTRACT

A light-emitting substrate, a manufacturing method thereof, and a display device are provided. The light-emitting substrate includes a driving circuit layer, a light-emitting diode (LED) chip, an encapsulation layer, and a cover plate. The driving circuit layer includes a binding electrode. A connection electrode of the LED chip is connected to the binding electrode. The encapsulation layer is disposed on a side of
(Continued)

the LED chip away from the driving circuit layer. The encapsulation layer covers the LED chip and the driving circuit layer. The cover plate is disposed on a side of the encapsulation layer away from the LED chip. A surface of the cover plate away from the encapsulation layer is a light-emitting surface of the light-emitting substrate.

18 Claims, 10 Drawing Sheets

(52) U.S. Cl.
CPC .............. *H01L 24/17* (2013.01); *H01L 24/32* (2013.01); *H01L 24/73* (2013.01); *H10H 20/857* (2025.01); *H01L 2224/05568* (2013.01); *H01L 2224/05573* (2013.01); *H01L 2224/13111* (2013.01); *H01L 2224/13123* (2013.01); *H01L 2224/13124* (2013.01); *H01L 2224/13139* (2013.01); *H01L 2224/13147* (2013.01); *H01L 2224/13186* (2013.01); *H01L 2224/16147* (2013.01); *H01L 2224/16148* (2013.01); *H01L 2224/17181* (2013.01); *H01L 2224/32227* (2013.01); *H01L 2224/73204* (2013.01); *H01L 2924/0549* (2013.01)

(58) Field of Classification Search
CPC ......... H01L 24/17; H01L 24/32; H01L 24/73; H01L 2224/05568; H01L 2224/05573; H01L 2224/13111; H01L 2224/13123; H01L 2224/13124; H01L 2224/13139; H01L 2224/13147; H01L 2224/13186; H01L 2224/16147; H01L 2224/16148; H01L 2224/17181; H01L 2224/32227; H01L 2924/0549; H01L 23/08; H01L 23/145; H01L 23/3121; H01L 23/49827; H10H 20/018; H10H 20/0364; H10H 20/8513; H10H 20/852; H10H 20/857
See application file for complete search history.

(56) References Cited

U.S. PATENT DOCUMENTS

| | | | |
|---|---|---|---|
| 2019/0096864 A1* | 3/2019 | Huitema | ............... H01L 25/167 |
| 2020/0118989 A1* | 4/2020 | Wang | ................... H10H 20/857 |
| 2021/0225901 A1 | 7/2021 | Luo et al. | |
| 2021/0327861 A1* | 10/2021 | Chen | ..................... H01L 25/167 |

FOREIGN PATENT DOCUMENTS

| | | |
|---|---|---|
| CN | 109904186 A | 6/2019 |
| CN | 111769108 A | 10/2020 |
| CN | 114664745 A | 6/2022 |
| KR | 20190035319 A | 4/2019 |
| KR | 20210047590 A | 4/2021 |

OTHER PUBLICATIONS

Japanese Office Action issued in corresponding Japanese Patent Application No. 特願 2022-546048 dated Aug. 27, 2024, pp. 1-3, 6pp.
Korean Office Action issued in corresponding Korean Patent Application No. 10-2023-7014417 dated Oct. 14, 2024, pp. 1-7, 16pp.
PCT International Search Report for International Application No. PCT/CN2022/105166, mailed on Nov. 28, 2022, 8pp.
PCT Written Opinion of the International Search Authority for International Application No. PCT/CN2022/105166, mailed on Nov. 28, 2022, 9pp.

* cited by examiner

LIGHT-EMITTING SUBSTRATE, MANUFACTURING METHOD THEREOF, AND DISPLAY DEVICE

This application is a National Phase of PCT Patent Application No. PCT/CN2022/105166 having International filing date of Jul. 12, 2022, which claims the benefit of priority of Chinese Patent Application No. 202210751104.0, filed Jun. 28, 2022, the contents of which are all incorporated herein by reference in their entirety.

FIELD OF DISCLOSURE

The present disclosure relates to the field of display technologies, in particular to a light-emitting substrate and a manufacturing method and a display device.

BACKGROUND

Micro light-emitting diodes (Micro-LEDs) and sub-millimeter light-emitting diodes (Mini-LEDs) are new display technologies developed by market in recent years. These display technologies have many unparalleled advantages such as long lifespan, low image delay, wide color gamut, high refresh rate, etc. With a gradual decline in cost and maturity of related technologies, MLED (Mini-LED/Micro-LED) display device will gradually become a mainstream solution in the market. A traditional solution for forming an MLED structure is usually to first form a driving circuit and a binding electrode on a glass substrate, then transfer them directly on the glass substrate, bind LED chips, and finally apply a layer of encapsulation adhesive. Although the structure is simple, since a display surface is located on a side of the encapsulation adhesive and the driving circuit, a surface scratch resistance of the display device is weak.

SUMMARY OF DISCLOSURE

The present disclosure provides a light-emitting substrate, a manufacturing method thereof, and a display device to solve a technical problem that a surface scratch resistance of a MLED display device in the prior art is weak.

The present disclosure provides a light-emitting substrate, including:
  a driving circuit layer including a binding electrode;
  a light-emitting diode (LED) chip including a connection electrode, where the connection electrode is connected to the binding electrode;
  an encapsulation layer disposed on a side of the LED chip away from the driving circuit layer, wherein the encapsulation layer covers the LED chip and the driving circuit layer;
  a cover plate disposed on a side of the encapsulation layer away from the LED chip, where a surface of the cover plate away from the encapsulation layer is a light-emitting surface of the light-emitting substrate.

Alternatively, in some embodiments of the present disclosure, the light-emitting substrate further includes a substrate, and the substrate is disposed on a side of the driving circuit layer away from the LED chip.

Alternatively, in some embodiments of the present disclosure, the driving circuit layer further includes a bonding pad, the substrate is a flexible substrate, a via hole is provided on the substrate, and the via hole is arranged corresponding to the bonding pad and exposes a surface of the bonding pad away from the cover plate; and the light-emitting substrate further includes at least one driver chip, the driver chip includes a binding pin, and the binding pin is correspondingly connected to the bonding pad through the via hole.

Alternatively, in some embodiments of the present disclosure, a diameter of the via hole is greater than a radial dimension of the binding pin, and at least a portion of the binding pin is disposed in the via hole.

Alternatively, in some embodiments of the present disclosure, the binding pin is fastened to the via hole.

Alternatively, in some embodiments of the present disclosure, the driving circuit layer further includes a bonding pad, the light-emitting substrate further includes at least one driver chip, the driver chip is disposed on a side of the driving circuit layer away from the LED chip, the driver chip includes a binding pin, and the binding pin is correspondingly connected to the bonding pad.

Alternatively, in some embodiments of the present disclosure, the binding pin is in contact with the bonding pad, and a metallic bond is formed between the binding pin and the bonding pad.

Alternatively, in some embodiments of the present disclosure, the light-emitting substrate further includes a conductive adhesive layer, the conductive adhesive layer is disposed between the bonding pad and the driver chip, and the binding pin and the bonding pad are connected through the conductive adhesive layer.

Alternatively, in some embodiments of the present disclosure, the light-emitting substrate is a display panel or a backlight.

Correspondingly, the present disclosure further provides a display device. The display device is formed by splicing at least two light-emitting substrates according to any one of the above.

Correspondingly, the present disclosure further provides a manufacturing method of a light-emitting substrate, including:
  providing a rigid substrate;
  sequentially forming a substrate and a driving circuit layer on the rigid substrate, where the driving circuit layer includes a binding electrode and a bonding pad;
  providing a plurality of light-emitting diode (LED) chips, where a connection electrode of one of the LED chips is correspondingly bound and connected to the binding electrode;
  sequentially forming an encapsulation layer and a cover plate on a side of the LED chips away from the rigid substrate;
  removing the rigid substrate.

Alternatively, in some embodiments of the present disclosure, further including:
  performing a full-surface etching or a hole-forming etching on the substrate to expose a surface of the bonding pad away from the cover plate;
  providing a driver chip, and binding the driver chip to the bonding pad.

The present disclosure provides the light-emitting substrate, the manufacturing method thereof, and the display device. In the light-emitting substrate, the driving circuit layer includes a plurality of binding electrodes. Each of the LED chips includes two connection electrodes. Each of the connection electrodes is connected to the corresponding binding electrode. The encapsulation layer is disposed on the side of the LED chip away from the driving circuit layer. The encapsulation layer covers the LED chip and the driving circuit layer. The cover plate is disposed on the side of the encapsulation layer away from the LED chip. The surface of the cover plate away from the encapsulation layer is the light-emitting surface of the light-emitting substrate. In the present disclosure, by binding the LED chip upside down in the light-emitting substrate, a surface scratch resistance of the light-emitting substrate can be improved, an ability of the light-emitting substrate to resist water and oxygen corrosion is improved, and a product reliability is improved. Furthermore, by removing or half-etching the substrate, the driver chip is bound to a side of the driving circuit layer away from the cover plate. A double-sided binding method is adopted, which can achieve a purpose of reducing borders or no borders.

BRIEF DESCRIPTION OF DRAWINGS

In order to illustrate technical solutions in the embodiments of the present disclosure more clearly, the following briefly introduces the accompanying drawings used in the description of the embodiments. Obviously, the drawings in the following description are only some implementations of the present disclosure. For example, for those skilled in the art, other drawings can also be obtained based on these drawings without any creative efforts.

DETAILED DESCRIPTION

The following will clearly and completely describe the technical solutions in the embodiments of the present disclosure with reference to the drawings in the embodiments of the present disclosure. Obviously, the described embodiments are only a part of the embodiments of the present disclosure, but not all of them. Example. Based on the embodiments in the present disclosure, all other embodiments obtained by those skilled in the art without creative work fall within the protection scope of the present disclosure.

In the description of the present disclosure, it should be understood that the terms "first" and "second" are used for descriptive purposes only, and should not be understood as indicating or implying relative importance or implying the number of indicated technical features. Thus, features defined as "first" and "second" etc. may expressly or implicitly include one or more of said features and are therefore not to be construed as limiting the present disclosure.

The present disclosure provides a light-emitting substrate, a manufacturing method thereof, and a display device, which are described in detail below. It should be noted that the description order of the following embodiments is not intended to limit the preferred order of the embodiments of the present disclosure.

Figure 1:
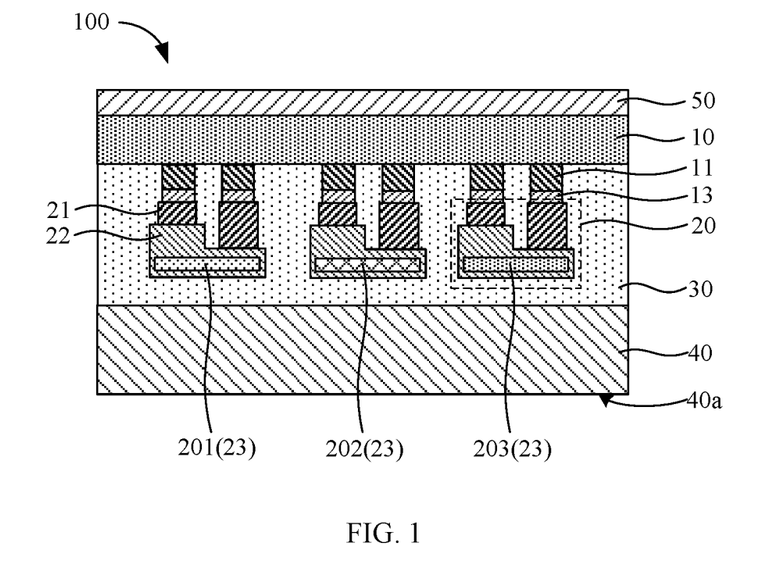
FIG. 1 is a first structural schematic diagram of a light-emitting substrate of the present disclosure.

Referring to FIG. 1, which is a first structural schematic diagram of a light-emitting substrate of the present disclosure. In an embodiment of the present disclosure, the light-emitting substrate 100 includes a driving circuit layer 10, a light-emitting diode (LED) chip 20, an encapsulation layer 30, and a cover plate 40. The driving circuit layer 10 includes a binding electrode 11. The LED chip 20 includes a connection electrode 21. The connection electrode 21 is connected to the binding electrode 11. The encapsulation layer 30 is disposed on a side of the LED chip 20 away from the driving circuit layer 10. The encapsulation layer 30 covers the LED chip 20 and the driving circuit layer 10. The cover plate 40 is disposed on a side of the encapsulation layer 30 away from the LED chip 20. A surface 40a of the cover plate 40 away from the encapsulation layer 30 is a light-emitting surface of the light-emitting substrate 100.

In the embodiment of the present disclosure, the LED chip 20 is bound upside down, and the surface 40a of the cover plate 40 away from the encapsulation layer 30 is used as the light-emitting surface of the light-emitting substrate 100. Due to a high hardness of the cover plate 40, a scratch resistance of the surface of the light-emitting substrate 100 can be improved, and the LED chip 20 and the driving circuit layer 10 can be prevented from being scratched by external substances. In addition, in the related art, the binding electrode 11 and the connection electrode 21 are disposed on the outside, exposed to the encapsulation layer 30, and easily corroded by water and oxygen. In the light-emitting substrate 100 of the embodiment of the present disclosure, the binding electrode 11 and the connection electrode 21 are disposed inside the light-emitting substrate 100, which can improve the resistance of the light-emitting substrate 100 to water and oxygen corrosion, and improve product reliability.

In an embodiment of the present disclosure, the driving circuit layer 10 is configured to provide the LED chip 20 with driving signals, such as a driving voltage and a power supply voltage. The driving circuit layer 10 may include a thin film transistor functional layer disposed on the substrate, and a specific structure of the thin film transistor functional layer may refer to the prior art, which will not be repeated here.

In the embodiment of the present disclosure, the binding electrode 11 is used as a signal output terminal to lead out a driving signal on the driving circuit layer 10. A number of the binding electrodes 11 can be set to at least two, depending on the number of LED chips 20. The binding electrode 11 is made of copper, aluminum, magnesium, silver, tin, indium tin oxide, and other conductive materials with good conductivity and low melting point. The binding electrodes 11 may be arranged in an array. The number and arrangement of the binding electrodes 11 can be designed according to actual requirements such as a resolution of the light-emitting substrate 100, which is not specifically limited in the present disclosure.

In an embodiment of the present disclosure, at least two LED chips 20 may be provided. Each LED chip 20 is provided with two connection electrodes 21. The driving circuit layer 10 is provided with two binding electrodes 11 spaced apart corresponding to each LED chip 20. The two binding electrodes 11 are respectively used to lead out different driving signals in the driving circuit layer 10. Each connection electrode 21 and the corresponding binding electrode 11 can be connected by a solder paste 13, or may also be directly connected through fusion welding, metallic bonds, etc., which is not specifically limited in the present disclosure.

In an embodiment of the present disclosure, the LED chips 20 may be Mini-LED chips, Micro-LED chips, or the like. A number of LED chips 20 can be set according to requirements such as a size of the light-emitting substrate 100 and a luminous brightness. The LED chip 20 further includes a luminescent material layer 23, a protective layer 22, a first electrode, and a second electrode. The first electrode and the second electrode are deposited on the luminescent material layer 23. Each connection electrode 21 is connected to the first electrode or the second electrode. Alternatively, in one LED chip 20, one of the connection electrodes 21 is the first electrode, and the other connection electrode 21 is the second electrode. Apparently, the structure of the LED chip 20 in the present disclosure is not limited to this.

A light-emitting material of the LED chip 20 may be an inorganic light-emitting material such as gallium nitride or an organic light-emitting material such as quantum dots. The LED chip 20 can emit red light, blue light, green light, white light, yellow light, and the like. When manufacturing the LED chip 20, different luminescent materials can be selected according to different luminous color requirements.

In an embodiment of the present disclosure, the plurality of LED chips 20 include a red LED chip, a green LED chip, and a blue LED chip. In the red LED chip, the luminescent material layer 23 is a red luminescent material layer 201. In the green LED chip, the luminescent material layer 23 is a green luminescent material layer 202. In the blue LED chip, the luminescent material layer 23 is a blue luminescent material layer 203.

In the embodiment of the present disclosure, material of the encapsulation layer 30 is generally transparent to improve a light transmittance of the light-emitting substrate 100. Specifically, the material of the encapsulation layer 30 may be an optically clear adhesive (OCA) or other transparent adhesives. In the embodiments of the present disclosure, the optically clear adhesive is used to form the encapsulation layer 30, on the one hand, it can improve a light-emitting efficiency of the light-emitting substrate 100. On the other hand, an adhesive force between the driving circuit layer 10 and the cover plate 40 can be improved, and a structural stability of the light-emitting substrate 100 can be improved. In a third aspect, since the encapsulation layer 30 covers the LED chip 20, the LED chip 20 can be fixed and protected.

In an embodiment of the present disclosure, the cover plate 40 may be a glass cover plate or other hard transparent cover plate. The cover plate 40 supports and protects other functional film layers in the light-emitting substrate 100. Since the surface 40a of the cover plate 40 away from the encapsulation layer 30 is the light-emitting surface of the light-emitting substrate 100, the cover plate 40 is set as a transparent cover plate, which can improve a light-emitting efficiency of the light-emitting substrate 100.

In one embodiment of the present disclosure, the light-emitting substrate 100 further includes a substrate 50. The substrate 50 is disposed on a side of the driving circuit layer 10 away from the LED chip 20.

The substrate 50 can be a flexible substrate or a rigid substrate. The substrate 50 may include one or more than two layers of flexible polyimide (PI). The substrate 50 can also be made of resin or the like.

In the embodiment of the present disclosure, the substrate 50 is disposed on the side of the driving circuit layer 10 away from the LED chip 20, which can protect and support the driving circuit layer 10 and improve the structural stability of the light-emitting substrate 100.

In an embodiment of the present disclosure, the light-emitting substrate 100 may further include a driver chip. The driver chip is used to provide driving signals or power voltages to the driving circuit layer 10. The driver chip can be arranged on a border area of the light-emitting substrate 100, or on a side of the light-emitting substrate 100, or on a backside of the light-emitting substrate 100. The specific content will be described in the following embodiments, and will not be repeated here.

Figure 2:
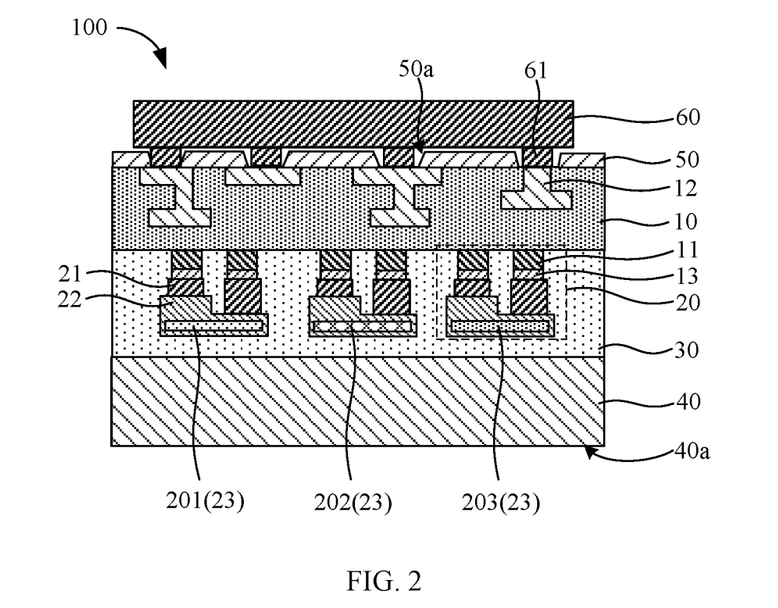
FIG. 2 is a second structural schematic diagram of a light-emitting substrate of the present disclosure.

Referring to FIG. 2, FIG. 2 is a second structural schematic diagram of a light-emitting substrate of the present disclosure. A difference from the light-emitting substrate 100 described in FIG. 1 is that, in an embodiment of the present disclosure, the driving circuit layer 10 further includes a bonding pad 12. The substrate 50 is a flexible substrate, and a via hole 50a is provided on the substrate 50. The via hole 50a is disposed corresponding to the bonding pad 12 and exposes a surface of each bonding pad 12 away from the cover plate 40.

The light-emitting substrate 100 further includes at least one driver chip 60. The driver chip 60 includes a binding pin 61. The binding pin 61 is connected to the corresponding bonding pad 12 through the via hole 50a.

The driver chip 60 can be set to 1. A number of driver chips 60 can be set to two or more. The number of driver chips 60 can be specifically set according to a size of the light-emitting substrate 100. The bonding pad 12 can be set in multiples. A number of binding pins 61 can be equal to the number of bonding pad 12. The bonding pads 12 are connected to the binding pins 61 in a one-to-one correspondence.

The bonding pad 12 is bound and connected to the binding pin 61 to output the driving voltage or the power supply voltage output by the driver chip 20 to the driving circuit or the power wiring in the driving circuit layer 10.

Figure 3:
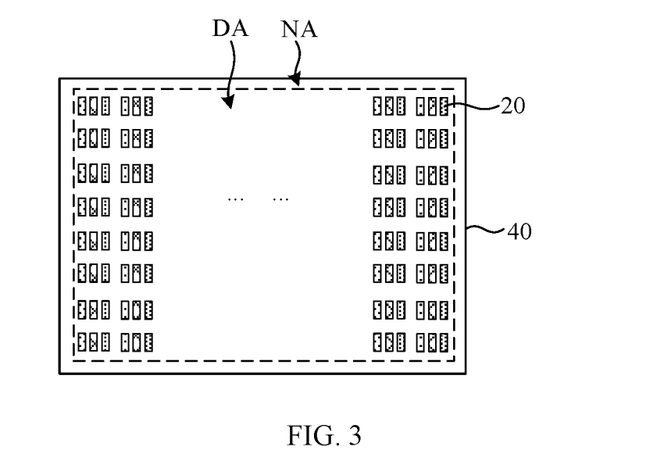
FIG. 3 is a plane view of a light-emitting surface of a light-emitting substrate of the present disclosure.
Figure 4:
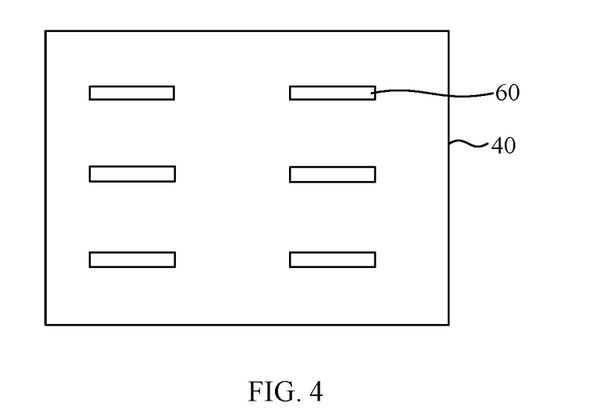
FIG. 4 is a plane view of a backside of a light-emitting substrate of the present disclosure.

Specifically, refer to FIG. 3 and FIG. 4. FIG. 3 is a plane view of a light-emitting surface of a light-emitting substrate of the present disclosure. FIG. 4 is a plane view of a backside of a light-emitting substrate of the present disclosure. As shown in FIG. 3, the light-emitting substrate 100 includes a display area DA and a non-display area NA connected to the display area DA. The driver chip 20 is arranged in the display area DA. The non-display area NA is mainly provided with some wirings for transmitting signals, which will not be repeated here. Apparently, in some embodiments, the light-emitting substrate 100 may also only include the display area DA to achieve no border. The driver chip 60 is bound on the backside of the light-emitting substrate 100. A plurality of driver chips 60 can be provided, and the plurality of driver chips 60 can be arranged on the backside of the light-emitting substrate 100 in an array. Apparently, regarding the setting of the driver chips 60, the present disclosure is not limited to this, and can be specifically set according to the actual structure of the light-emitting substrate 100.

In the embodiment of the present disclosure, since the substrate 50 is a flexible substrate, holes can be formed on the substrate 50 by etching technology, and then the binding of the driver chip 60 and the driving circuit layer 10 can be realized. For example, when the substrate 50 is a PI flexible substrate, the substrate 50 can be etched with a chemical solution based on the characteristics of a PI material.

In the embodiment of the present disclosure, the LED chip 20 is bound on a side of the driving circuit layer 10 close to the cover plate 40, and the driver chip 60 is bound on a side of the substrate 50 away from the cover plate 40. By using a double-sided bonding technology and the etching technology of the substrate 50, the driver chip 60 can be disposed on the backside of the light-emitting substrate 100, which saves a space for binding the driver chip 60 on the side alone, so as to achieve the purpose of reducing the borders or having no borders. In addition, compared with the related art, the driver chip 60 is directly attached to the circuit board, which is less technically difficult.

Referring to FIG. 2, in the embodiment of the present disclosure, a diameter of the via hole 50a is greater than a radial dimension of the corresponding binding pin 61. At least a portion of the binding pin 61 is disposed in the corresponding via hole 50a.

In the embodiment of the present disclosure, the diameter of the via hole 50a is greater than the radial dimension of the corresponding binding pin 61. When binding the driver chip 60, the binding pin 61 can be deeply inserted into the via hole 50a, thereby reducing a thickness of the light-emitting substrate 100 and improving a binding stability of the driver chip 60.

In an embodiment of the present disclosure, a shape of the via hole 50a may be adapted to a shape of the binding pin 61. For example, cross-sectional structures of the via hole 50a and the binding pin 61 may be rectangular or the like. The binding pin 61 can be fastened to the via hole 50a to further improve the binding stability of the driver chip 60.

In an embodiment of the present disclosure, a length of the binding pin 61 may be greater than a depth of the via hole 50a. In this case, the binding pin 61 can be connected in contact with the corresponding bonding pad 12. A metallic bond is formed between the binding pin 61 and the corresponding bonding pad 12.

The metallic bonds are chemical bonds that connect atoms in metals together. They differ from covalent and ionic bonds because electrons in metallic bonds are delocalized. That is, they are not shared only between two atoms. Instead, the electrons in metallic bonds float freely in a lattice of metallic nucleus. This type of bonding imparts many unique material properties to metals, including excellent thermal and electrical conductivity, and high melting point and ductility. The metallic bonding enables good electrical conductivity between the binding pin 61 and the corresponding bonding pad 12.

Figure 5:
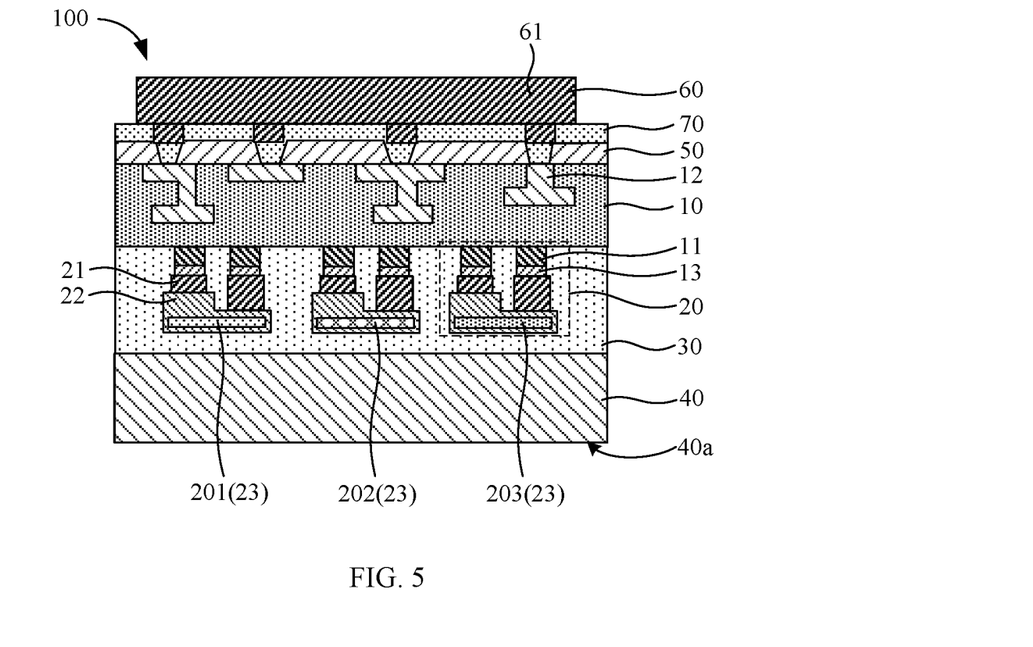
FIG. 5 is a third structural schematic diagram of a light-emitting substrate of the present disclosure.

Referring to FIG. 5, FIG. 5 is a third structural schematic diagram of a light-emitting substrate of the present disclosure. A difference from the light-emitting substrate 100 shown in FIG. 2 is that, in the embodiment of the present disclosure, the light-emitting substrate 100 further includes a conductive adhesive layer 70. The conductive adhesive layer 70 is disposed between the bonding pad 12 and the driver chip 60. The binding pin 61 and the corresponding bonding pad 12 are connected through the conductive adhesive layer 70.

Material of the conductive adhesive layer 70 may be an anisotropic conductive film (ACF). The binding pin 61 and the corresponding bonding pad 12 are connected by conductive particles in the anisotropic conductive film to make them conduct. At the same time, short circuits between adjacent binding pins 61 or between adjacent bonding pads 12 can be prevented. Apparently, the conductive adhesive layer 70 can also be made of other conductive adhesives. The conductive adhesive layer 70 can also be provided separately for each binding pin 61 and the corresponding bonding pad 12.

Figure 6:
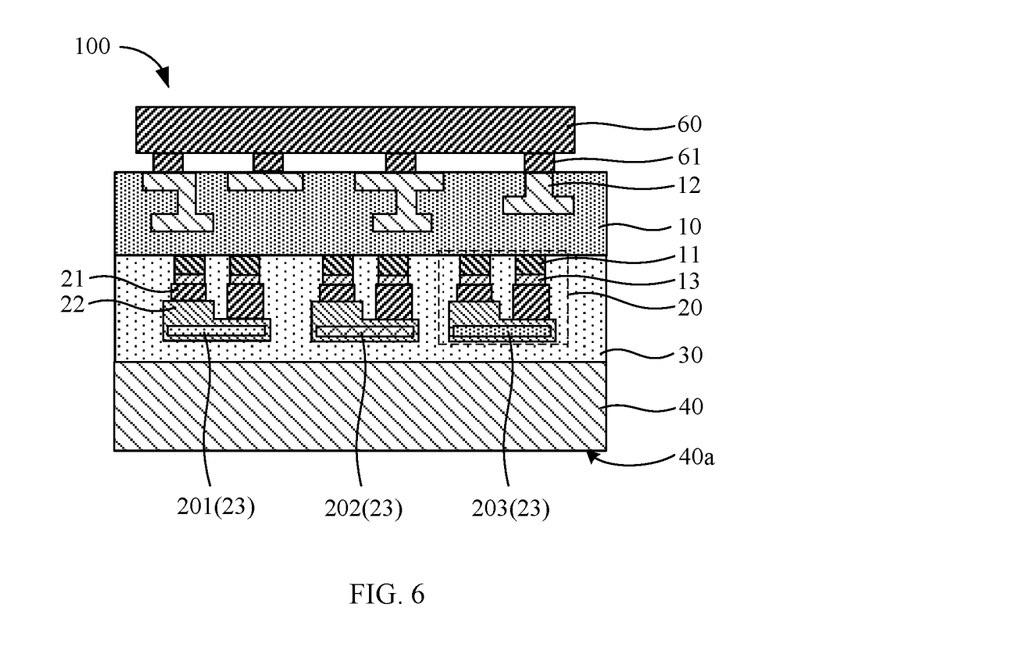
FIG. 6 is a fourth structural schematic diagram of a light-emitting substrate of the present disclosure.

Referring to FIG. 6, which is a fourth structural schematic diagram of a light-emitting substrate of the present disclosure. A difference from the light-emitting substrate 100 shown in FIG. 2 is that, in the embodiment of the present disclosure, the substrate 50 is not provided in the light-emitting substrate 100.

Similarly, in the embodiment of the present disclosure, the driving circuit layer 10 further includes a bonding pad 12. The light-emitting substrate 100 further includes at least one driver chip 60. The driver chip 60 is disposed on the side of the driving circuit layer 10 away from the LED chip 20. The driver chip 60 includes a binding pin 61. The binding pin 61 is connected to the corresponding bonding pad 12.

The binding pin 61 can be connected in contact with the corresponding bonding pad 12. A metallic bond is formed between the binding pin 61 and the corresponding bonding pad 12. That is, the binding pin 61 and the corresponding bonding pad 12 are connected through the metallic bond, so that the binding pin 61 and the corresponding bonding pad 12 have good electrical conductivity.

The light-emitting substrate 100 provided by the embodiment of the present disclosure does not include a substrate. On the one hand, a thickness of the light-emitting substrate 100 can be further thinned to realize a thinned light-emitting substrate 100. On the other hand, the binding between each binding pin 61 and the corresponding bonding pad 12 is more convenient, and poor binding can be prevented.

Figure 7:
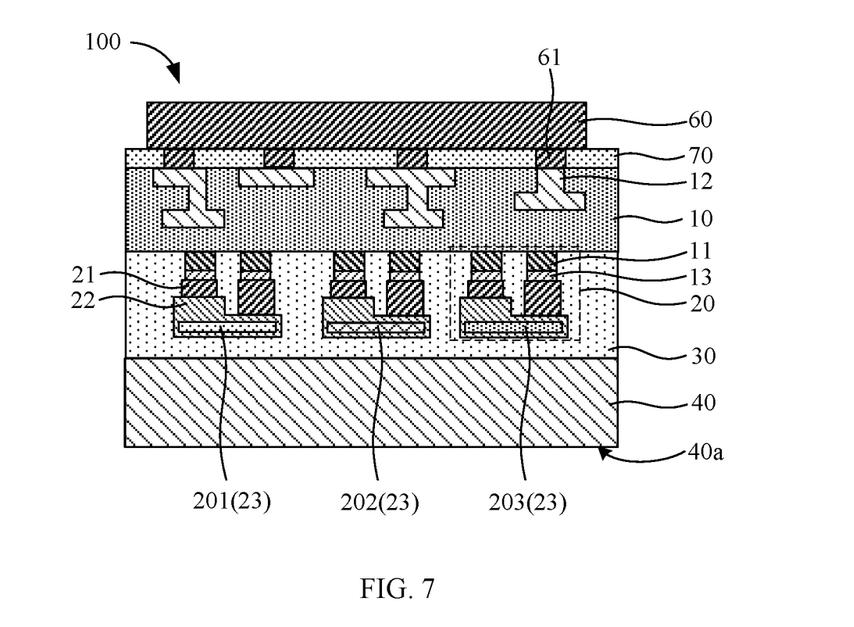
FIG. 7 is a fifth structural schematic diagram of a light-emitting substrate of the present disclosure.

Referring to FIG. 7, which is a fifth structural schematic diagram of a light-emitting substrate of the present disclosure. A difference from the light-emitting substrate 100 shown in FIG. 6 is that, in the embodiment of the present disclosure, the light-emitting substrate 100 further includes a conductive adhesive layer 70. The conductive adhesive layer 70 is disposed between the bonding pad 12 and the driver chip 60. The binding pin 61 and the corresponding bonding pad 12 are connected through the conductive adhesive layer 70.

Similarly, material of the conductive adhesive layer 70 can be an anisotropic conductive film. The binding pin 61 and the corresponding bonding pad 12 are connected by conductive particles in the anisotropic conductive film to make them conduct. At the same time, short circuits between adjacent binding pins 61 or adjacent bonding pads 12 can be prevented. Apparently, the conductive adhesive layer 70 can also be made of other conductive adhesives. The conductive adhesive layer 70 can also be provided separately for each binding pin 61 and the corresponding bonding pad 12.

In some embodiments of the present disclosure, the light-emitting substrate 100 may be a display panel. For example, the light-emitting substrate 100 can be a Mini-LED display panel, a Micro-LED display panel, or the like. In some embodiments of the present disclosure, the light-emitting substrate 100 may also be a backlight. For example, the light-emitting substrate 100 can be used as a backlight source of a liquid crystal display device to provide the display panel with the backlight required for display.

Figure 8:
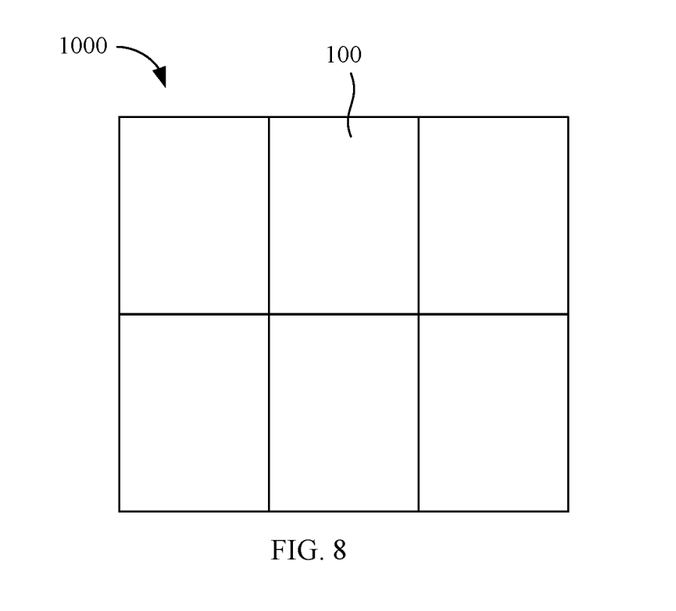
FIG. 8 is a structural schematic diagram of a display device of the present disclosure.

Correspondingly, refer to FIG. 8, which is a structural schematic diagram of a display device of the present disclosure. In the embodiment of the present disclosure, the display device 1000 is formed by splicing at least two light-emitting substrates 100. The light-emitting substrate 100 is the light-emitting substrate 100 described in any of the above embodiments, and details are not described herein again.

In the display device 1000, the embodiment of the present disclosure adopts a way of binding the LED chip upside down, and the surface 40a of the cover plate away from the encapsulation layer is used as the light-emitting surface of the light-emitting substrate, that is, a light-emitting surface of display device 1000. Due to a high hardness of the cover plate, a surface scratch resistance of the light-emitting substrate can be improved, and the LED chip and the driving circuit layer can be prevented from being scratched by external substances, thereby improving the product reliability of the display device 1000.

In addition, in some embodiments of the present disclosure, by using double-sided bonding and substrate etching technologies, the driver chip can be arranged on the backside of the light-emitting substrate 100, so as to achieve the purpose of reducing the border or no border of the light-emitting substrate 100. When the display device 1000 is formed by splicing at least two light-emitting substrates 100, a seam can be effectively reduced, and a display performance of the display device 1000 can be improved.

Figure 9:
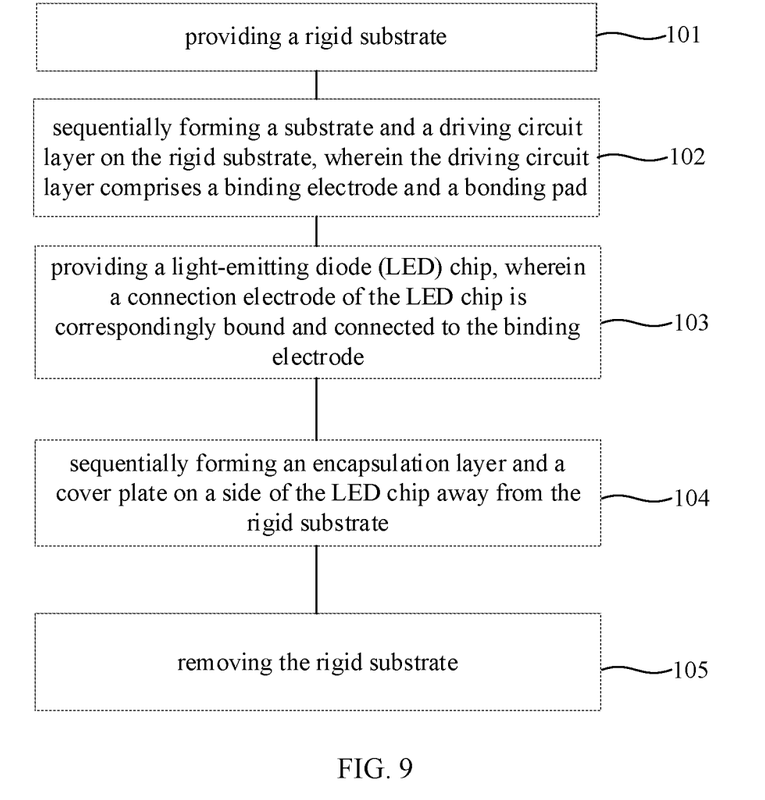
FIG. 9 is a first flowchart of a manufacturing method of a light-emitting substrate of the present disclosure.
Figure 10A:
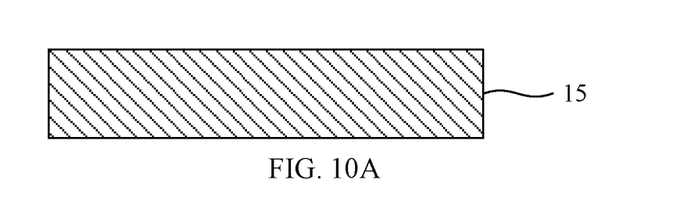
FIG. 10A to FIG. 10E are schematic structural diagrams obtained from steps 101 to 105 in the manufacturing method of the light-emitting substrate of the present disclosure.

Correspondingly, the present disclosure also provides a manufacturing method of a light-emitting substrate. Referring to FIG. 9 and FIG. 10A to FIG. 10E for details. FIG. 9 is a flowchart of a manufacturing method of a light-emitting substrate of the present disclosure. FIG. 10A to FIG. 10E are schematic structural diagrams obtained from steps 101 to 105 in the manufacturing method of the light-emitting substrate of the present disclosure. The manufacturing method of the light-emitting substrate specifically includes the following steps:

101, a rigid substrate is provided.

As shown in FIG. 10A, the rigid substrate may be a glass substrate, a resin substrate, or a rigid substrate, and configured to support.

Figure 10B:
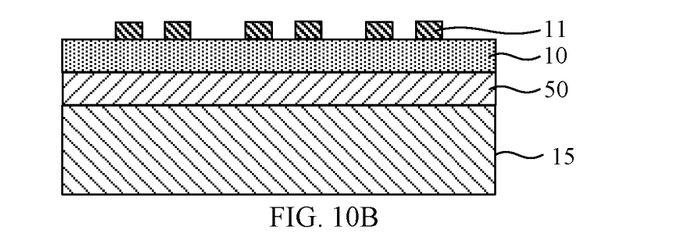

102, a substrate and a driving circuit layer are sequentially formed on the rigid substrate, and the driving circuit layer includes a binding electrode and a plurality of bonding pads.

As shown in FIG. 10B, a substrate 50 is first deposited on the rigid substrate 15. The substrate 50 can be a flexible PI substrate.

Then, a driving circuit layer 10 is formed on the substrate 50. The driving circuit layer 10 may include a plurality of binding electrodes 11 and a plurality of bonding pads 12. The driving circuit layer 10 may include a thin film transistor functional layer disposed on the substrate 50. For the specific structure of the functional layer of the thin film transistor, reference may be made to the prior art, which will not be repeated here. Both the binding electrode 11 and the bonding pad 12 are connected to the thin film transistor functional layer.

The embodiment of the present disclosure adopts a glass-based MLED process, and a flat panel display process can be used to form driving transistors, that is, to form the driving circuit layer 10, so as to realize active driving.

Figure 10C:
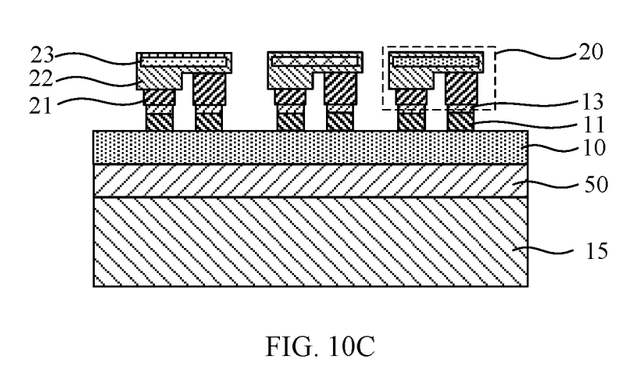

103, a plurality of LED chips are provided, and a connection electrode of one of the LED chips is correspondingly bound and connected to the binding electrode.

As shown in FIG. 10C, the LED chips 20 may be Mini-LED chips, Micro-LED chips, or the like. The LED chip 20 further includes a luminescent material layer 23, a protective layer 22, a first electrode, and a second electrode. The first electrode and the second electrode are deposited on the luminescent material layer 12. Each LED chip 20 includes two connection electrodes 21. Each connection electrode 21 is connected to the first electrode or the second electrode. Alternatively, in one LED chip 20, one of the connection electrodes 21 is the first electrode, and the other connection electrode 21 is the second electrode. Apparently, the structure of the LED chip 20 in the present disclosure is not limited to this.

Specifically, in the embodiment of the present disclosure, the LED chips 20 can be bound by a mass transfer technology. The LED chip 20 is bound in the forward direction and then applied upside down. Compared with a chip on board (COB, a bare chip is directly attached to a circuit board)/mounting technology in the related technology, a bonding efficiency, a bonding accuracy, product specifications, etc. can be improved.

Figure 10D:
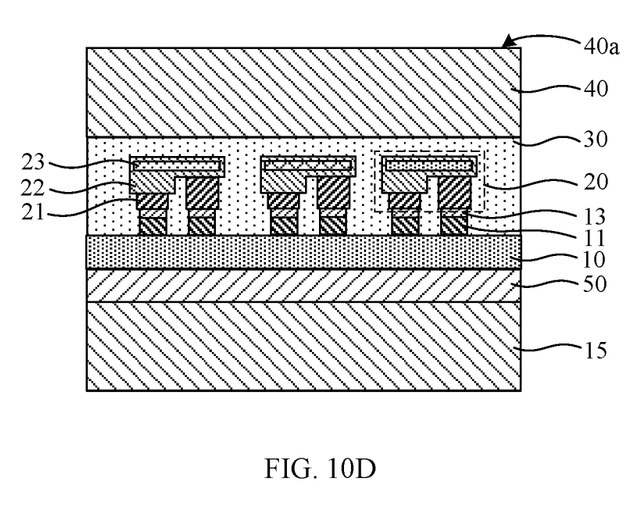

104, an encapsulation layer and a cover plate are sequentially formed on a side of the LED chip away from the rigid substrate.

As shown in FIG. 10D, an encapsulation protection adhesive is coated on a side of the LED chip 20 away from the rigid substrate 15 to form an encapsulation layer 30. Then, a cover plate 40 is attached on the encapsulation layer 30.

Material of the encapsulation layer 30 can be OCA or other transparent adhesive. The encapsulation layer 30 is formed by coating with transparent adhesive, which can improve the light-emitting efficiency of the light-emitting substrate 100. Since the encapsulation layer 30 covers the LED chip 20, the LED chip 20 can be fixed and protected.

The cover plate 40 can be a glass cover plate or other hard transparent cover plate. The cover plate 40 supports and protects other functional film layers in the light-emitting substrate 100. Since the surface 40a of the cover plate 40 away from the encapsulation layer 30 is the light-emitting surface of the light-emitting substrate 100, the cover plate 40 is set as a transparent cover plate, which can improve a light-emitting efficiency of the light-emitting substrate 100.

Figure 10E:
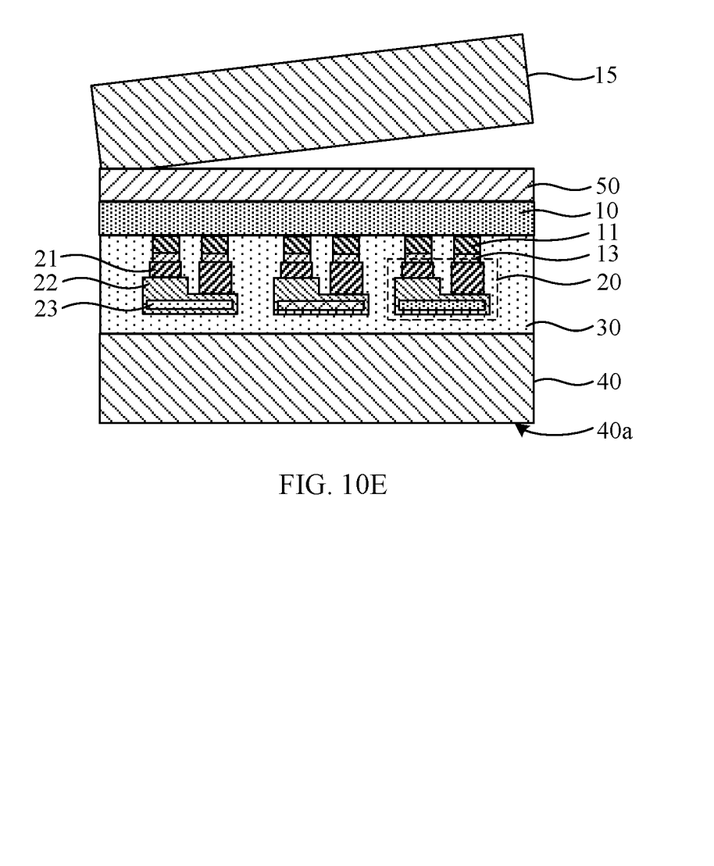

105, the rigid substrate is removed.

As shown in FIG. 10E, the light-emitting substrate formed in step 104 is inverted. The rigid substrate 15 is then separated from the substrate 50 using a laser lift-off technique or other processes. The laser lift-off technology is well known to those skilled in the art and will not be repeated here.

Furthermore, the driver chip can be bound in the light-emitting substrate. The driver chip 20 needs to be connected to the bonding pad 12 to output the driving signal to the driving circuit layer 10. The driver chip can be bound on a side of the light-emitting substrate, or can be bound on a backside of the driver substrate.

Figure 11:
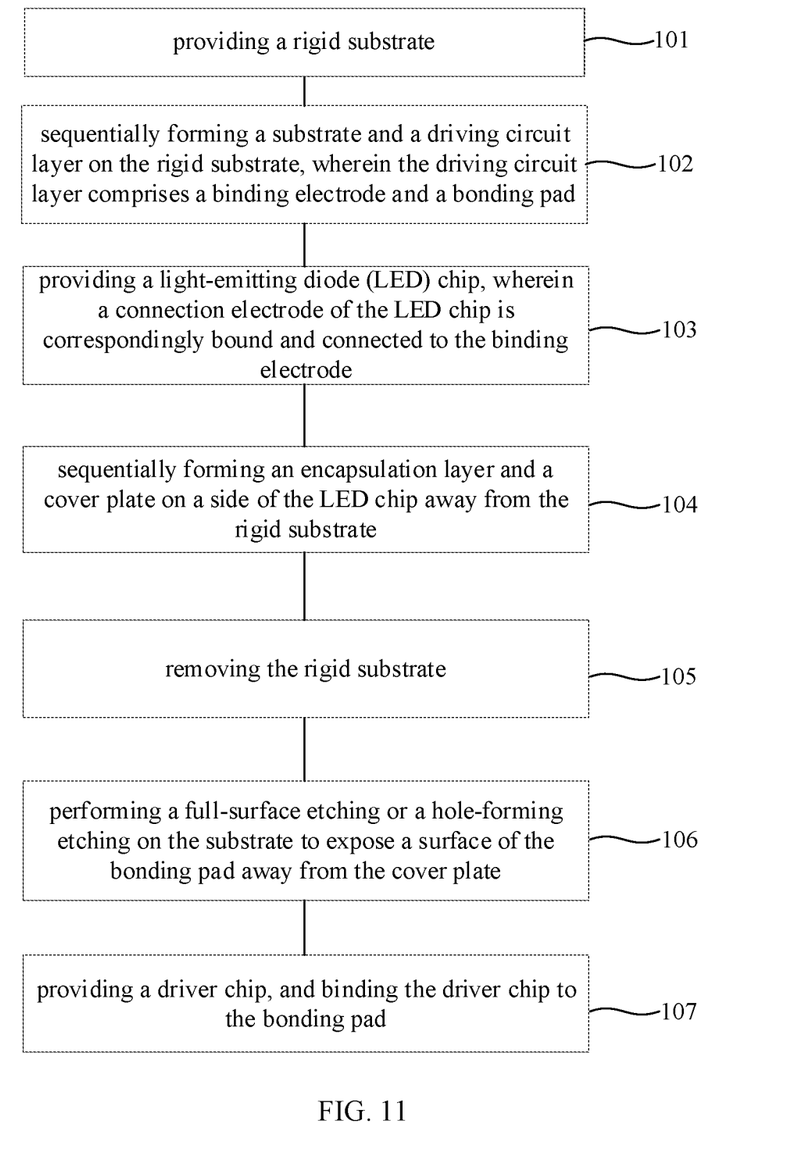
FIG. 11 is a second flowchart of a manufacturing method of a light-emitting substrate of the present disclosure.
Figure 12A:
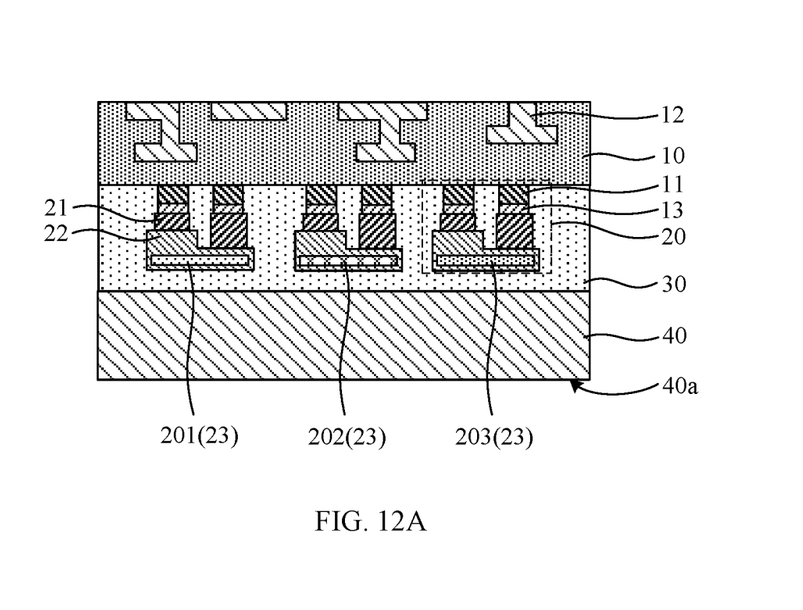
FIG. 12A to FIG. 12D are schematic structural diagrams obtained from steps 106 to 107 in the manufacturing method of the light-emitting substrate of the present disclosure.
Figure 12B:
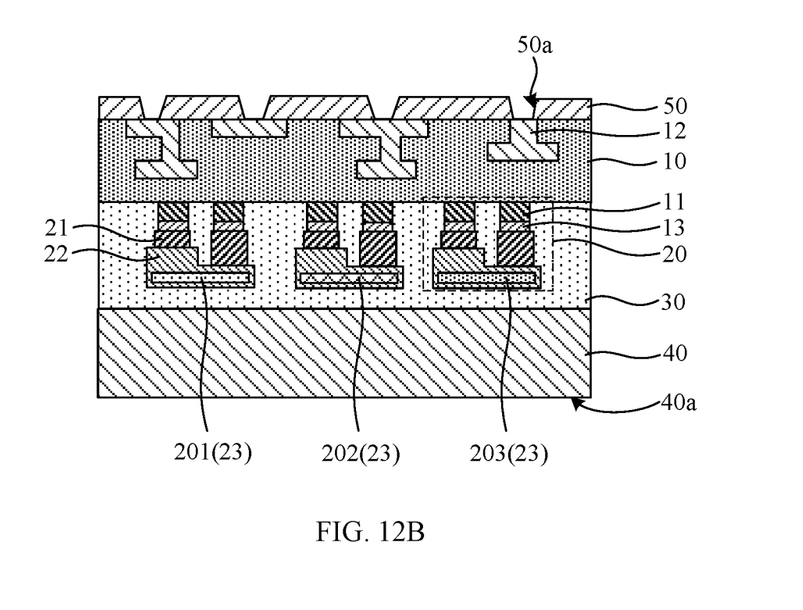

Specifically, refer to FIG. 11 and FIG. 12A to FIG. 12D. FIG. 11 is a second flowchart of a manufacturing method of a light-emitting substrate of the present disclosure. FIG. 12A to FIG. 12D are schematic structural diagrams obtained from steps 106 to 107 in the manufacturing method of the light-emitting substrate of the present disclosure. A difference from the manufacturing method of the light-emitting substrate shown in FIG. 9 is that, in the embodiment of the present disclosure, the manufacturing method of the light-emitting substrate further includes the following steps:

106, a full-surface etching or a hole-forming etching is performed on the substrate to expose a surface of the bonding pad away from the cover plate.

In some embodiments, as shown in FIG. 12A, a full-surface of the substrate 50 is etched. That is, the substrate 50 is removed to expose the surface of the bonding pad 12 away from the cover plate 40.

In other embodiments, as shown in FIG. 12B, the substrate 50 is subjected to a hole-forming and etching process to form a via hole 50a. The via hole 50a is disposed corresponding to the bonding pad 12 to expose a surface of each bonding pad 12 away from the cover plate 40.

Figure 12C:
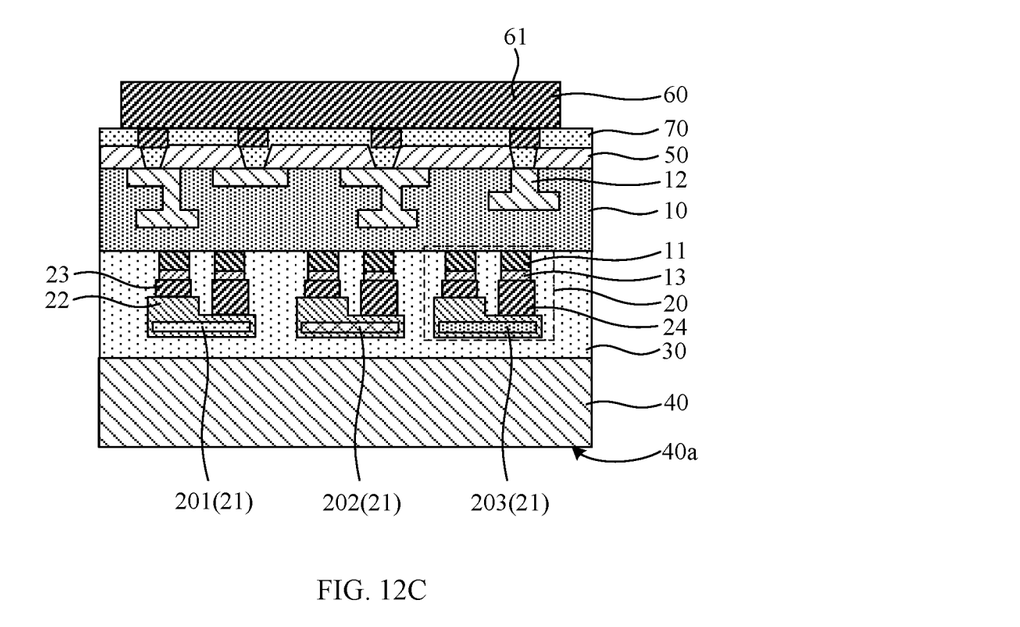
Figure 12D:
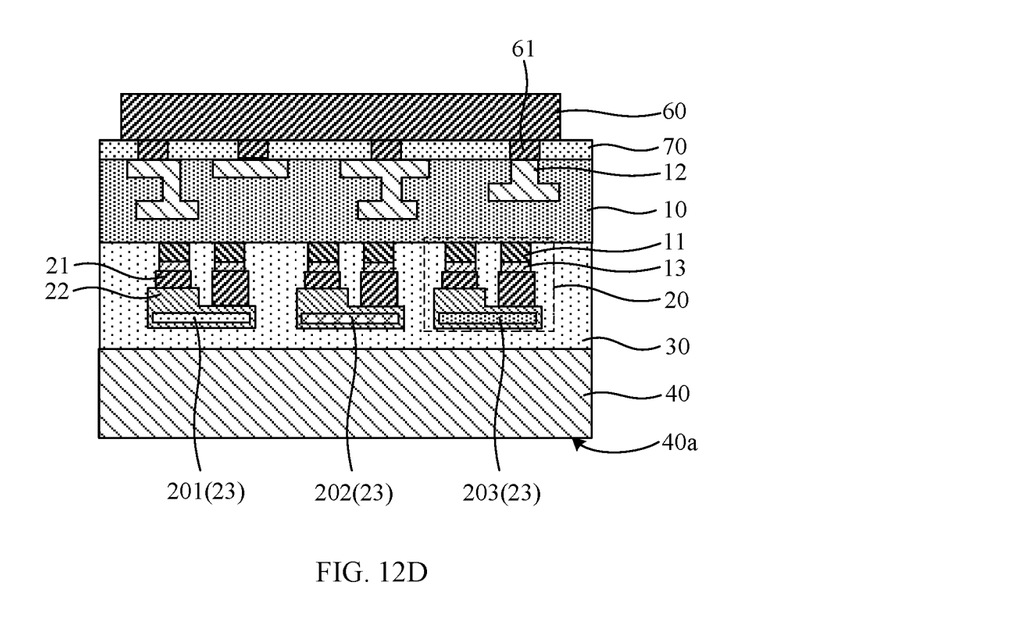

107, a driver chip is provided, and the driver chip is bound and connected to the bonding pad.

Specifically, the driver chip 60 may include a plurality of binding pins 61. The bonding pads 12 can be set in multiples. The number of binding pins 61 can be equal to the number of bonding pads 12. The bonding pads 12 are connected to the binding pins 61 in a one-to-one correspondence. The driver chip 60 outputs the driving signal or the power supply voltage through the binding pin 61.

In some embodiments, as shown in FIG. 12C, after the entire surface of the substrate 50 is etched, the driver chip 60 is bound to the driving circuit layer 10 through the binding pin 61 and the bonding pad 12.

In other embodiments, as shown in FIG. 12D, after the substrate 50 is formed with holes and etched, each binding pin 61 is connected to the corresponding bonding pad 12 through the via hole 50a.

A shape of the via hole 50a can be adapted to a shape of the binding pin 61. A diameter of the via hole 50a may also be larger than a radial dimension of the corresponding binding pin 61. At least a portion of the binding pin 61 is disposed in the corresponding via hole 50a.

In the embodiment of the present disclosure, the binding pin 61 can be connected to the corresponding bonding pad 12 by using the conductive adhesive layer 70, or the connection between the binding pin 61 and the corresponding bonding pad 12 can be realized through a metallic bonding process.

In the manufacturing method of the light-emitting substrate provided in the embodiments of the present disclosure, by etching the substrate 50 to form holes or etch the entire surface, the driver chip 60 can be bound to the backside of the light-emitting substrate 100, which saves a space for binding the driver chip 60 on the side alone, so as to achieve the purpose of reducing the border or having no border. In addition, in the embodiments of the present disclosure, the driving circuit layer 10 is a thin film layer. Using the separation or half-etching of the substrate 50 and a re-attachment technology of the encapsulation layer 30, both the driver chip 60 and the LED chip 20 are located on one side of the cover plate 40. Moreover, in the embodiment of the present disclosure, the driver chip 60 is directly bonded to a side of the cover plate 40 including the LED chip 20. The driver chip 60 is connected to the bonding pad 12 by forming holes in the substrate 50 or removing the substrate 50. Compared with the related art in which the driver chip 60 is directly attached to the circuit board, the technical difficulty is smaller.

The light-emitting substrate, the manufacturing method thereof, and the display device provided by the present disclosure are introduced in detail above. In this specification, specific embodiments are used to illustrate the principles and implementations of the present disclosure. The descriptions of the above embodiments are only used to help understand the method and the core idea of the present disclosure; meanwhile, for those skilled in the art, according to the idea of the present disclosure, there will be changes in the specific implementation and application scope. In conclusion, the content of this specification should not be construed as a limitation on the present disclosure.

What is claimed is:

1. A light-emitting substrate, comprising:
   a driving circuit layer comprising a binding electrode;
   a light-emitting diode (LED) chip comprising a connection electrode, wherein the connection electrode is connected to the binding electrode;
   an encapsulation layer disposed on a side of the LED chip away from the driving circuit layer, wherein the encapsulation layer covers the LED chip and the driving circuit layer; and
   a cover plate disposed on a side of the encapsulation layer away from the LED chip, wherein a surface of the cover plate away from the encapsulation layer is a light-emitting surface of the light-emitting substrate,
   wherein the light-emitting substrate further comprises a substrate, and the substrate is disposed on a side of the driving circuit layer away from the LED chip, the driving circuit layer further comprises a bonding pad, the substrate is a flexible substrate, a via hole is provided on the substrate, and the via hole is arranged corresponding to the bonding pad and exposes a surface of the bonding pad away from the cover plate; and
   the light-emitting substrate further comprises at least one driver chip, the driver chip comprises a binding pin, and the binding pin is correspondingly connected to the bonding pad through the via hole.

2. The light-emitting substrate according to claim 1, wherein a diameter of the via hole is greater than a radial dimension of the binding pin, and at least a portion of the binding pin is disposed in the via hole.

3. The light-emitting substrate according to claim 1, wherein the binding pin is fastened to the via hole.

4. The light-emitting substrate according to claim 1, wherein the driving circuit layer further comprises a bonding pad, the light-emitting substrate further comprises at least one driver chip, the driver chip is disposed on a side of the driving circuit layer away from the LED chip, the driver chip comprises a binding pin, and the binding pin is correspondingly connected to the bonding pad.

5. The light-emitting substrate according to claim 1, wherein the binding pin is in contact with the bonding pad, and a metallic bond is formed between the binding pin and the bonding pad.

6. The light-emitting substrate according to claim 1, wherein the light-emitting substrate further comprises a conductive adhesive layer, the conductive adhesive layer is disposed between the bonding pad and the driver chip, and the binding pin and the bonding pad are connected through the conductive adhesive layer.

7. The light-emitting substrate according to claim 1, wherein the light-emitting substrate is a display panel or a backlight.

8. A display device, wherein the display device is formed by splicing at least two light-emitting substrates according to claim 1.

9. The display device according to claim 8, wherein the light-emitting substrate further comprises a substrate, and the substrate is disposed on a side of the driving circuit layer away from the LED chip.

10. The display device according to claim 9, wherein the driving circuit layer further comprises a bonding pad, the substrate is a flexible substrate, a via hole is provided on the substrate, and the via hole is arranged corresponding to the bonding pad and exposes a surface of the bonding pad away from the cover plate; and the light-emitting substrate further comprises at least one driver chip, the driver chip comprises a binding pin, and the binding pin is correspondingly connected to the bonding pad through the via hole.

11. The display device according to claim 10, wherein a diameter of the via hole is greater than a radial dimension of the binding pin, and at least a portion of the binding pin is disposed in the via hole.

12. The display device according to claim 10, wherein the binding pin is fastened to the via hole.

13. The display device according to claim 8, wherein the driving circuit layer further comprises a bonding pad, the light-emitting substrate further comprises at least one driver chip, the driver chip is disposed on a side of the driving circuit layer away from the LED chip, the driver chip comprises a binding pin, and the binding pin is correspondingly connected to the bonding pad.

14. The display device according to claim 10, wherein the binding pin is in contact with the bonding pad, and a metallic bond is formed between the binding pin and the bonding pad.

15. The display device according to claim 10, wherein the light-emitting substrate further comprises a conductive adhesive layer, the conductive adhesive layer is disposed between the bonding pad and the driver chip, and the binding pin and the bonding pad are connected through the conductive adhesive layer.

16. The display device according to claim 8, wherein the light-emitting substrate is a display panel or a backlight.

17. A manufacturing method of a light-emitting substrate, comprising:

providing a rigid substrate;

sequentially forming a substrate and a driving circuit layer on the rigid substrate, wherein the driving circuit layer comprises a binding electrode and a bonding pad;

providing a plurality of light-emitting diode (LED) chips, wherein a connection electrode of one of the LED chips is correspondingly bound and connected to the binding electrode;

sequentially forming an encapsulation layer and a cover plate on a side of the LED chips away from the rigid substrate; and removing the rigid substrate.

18. The manufacturing method of the light-emitting substrate according to claim 17, further comprising:

performing a full-surface etching or a hole-forming etching on the substrate to expose a surface of the bonding pad away from the cover plate; and providing a driver chip, and binding the driver chip to the bonding pad.

\* \* \* \* \*